United States Patent
Wadell et al.

(10) Patent No.: US 8,058,093 B2
(45) Date of Patent: Nov. 15, 2011

(54) METHOD OF FORMING AN ENCAPSULATING ELECTRODE

(75) Inventors: Aaron Wadell, Wayne, PA (US); Jiangeng Xue, Piscataway, NJ (US)

(73) Assignee: Global Photonic Energy Corp., Medford Lakes, NJ (US)

( * ) Notice: Subject to any disclaimer, the term of this patent is extended or adjusted under 35 U.S.C. 154(b) by 303 days.

(21) Appl. No.: 11/211,656

(22) Filed: Aug. 26, 2005

(65) Prior Publication Data

US 2007/0048892 A1    Mar. 1, 2007

(51) Int. Cl.
| | |
|---|---|
| H01L 21/00 | (2006.01) |
| H01L 21/31 | (2006.01) |
| H01L 21/469 | (2006.01) |
| B05D 5/12 | (2006.01) |
| B28B 19/00 | (2006.01) |
| B29B 15/10 | (2006.01) |
| C23C 18/00 | (2006.01) |
| C23C 20/00 | (2006.01) |
| C23C 24/00 | (2006.01) |
| C23C 26/00 | (2006.01) |
| C23C 28/00 | (2006.01) |
| C23C 30/00 | (2006.01) |
| H01C 21/06 | (2006.01) |

(52) U.S. Cl. ........... 438/82; 438/763; 427/74; 427/96.4; 257/E51.013

(58) Field of Classification Search ............ 257/E51.02; 438/99, 64, 763; 427/74, 96.2, 97.1
See application file for complete search history.

(56) References Cited

U.S. PATENT DOCUMENTS

| | | | |
|---|---|---|---|
| 5,047,687 A | 9/1991 | Vanslyke et al. | |
| 5,273,608 A | 12/1993 | Nath | |
| 5,952,778 A | 9/1999 | Haskal et al. | |

(Continued)

FOREIGN PATENT DOCUMENTS

WO    WO 2004/057674 A2    7/2004

OTHER PUBLICATIONS

Wolf, Stanley and Richard Tauber, Silicon Processing For The VLSI Era, vol. 1, p. 438, Lattice Press, 2000.*

(Continued)

*Primary Examiner* — Matthew Landau
*Assistant Examiner* — Daniel Luke
(74) *Attorney, Agent, or Firm* — Finnegan, Henderson, Farabow, Garrett & Dunner, L.L.P.

(57) ABSTRACT

An organic photosensitive optoelectronic device is formed in which the organic photoconductive materials are encapsulated by an electrode of the device. A first transparent film is provided that comprises a first electrically conductive material, arranged on a transparent substrate. A first photoconductive organic material is deposited over the first electrically conductive material. A metal is deposited at an initial rate of no more than 1 nm/s over the first photoconductive organic material, completely covering any exposed portions of the first photoconductive organic material and any exposed interfaces with the first photoconductive organic material to a thickness of no less than 10 nm. After the thickness of no less than 10 nm is obtained, the metal is sputtered at an increased rate at least three times the initial rate until a cumulative thickness of the metal completely covering the previously exposed portions of the first photoconductive organic material and the previously exposed interfaces with the first conductive organic material is at least 250 nm.

21 Claims, 17 Drawing Sheets

U.S. PATENT DOCUMENTS

| | | | |
|---|---|---|---|
| 6,352,777 | B1 | 3/2002 | Bulovic et al. |
| 6,582,888 | B1 * | 6/2003 | Herbst et al. .................. 430/312 |
| 6,656,855 | B2 * | 12/2003 | Vulpio .......................... 438/780 |
| 6,657,378 | B2 * | 12/2003 | Forrest et al. ................. 313/503 |
| 6,720,203 | B2 * | 4/2004 | Carcia et al. .................... 438/99 |
| 6,794,020 | B2 | 9/2004 | Cotlear de Witzmann et al. |
| 2002/0051894 | A1 | 5/2002 | Yoshikawa |
| 2003/0188652 | A1 * | 10/2003 | Mclean et al. ............. 101/450.1 |
| 2003/0206267 | A1 * | 11/2003 | Noto et al. ................... 349/198 |
| 2004/0067324 | A1 * | 4/2004 | Lazarev et al. ............. 428/1.31 |
| 2004/0119403 | A1 | 6/2004 | McCormick et al. |
| 2005/0061364 | A1 * | 3/2005 | Peumans et al. ............. 136/263 |
| 2006/0231844 | A1 * | 10/2006 | Carter ............................ 257/79 |

OTHER PUBLICATIONS

Al-Ibrahim M. et al. 2004. Efficient large-area polymer solar cells on flexible substrates. Applied Physics Letters, vol. 85, No. 9, Aug. 30, 2004, pp. 1481-1483.

EPO Examination Report for EPO Application No. 06802368.8, dated Aug. 5, 2008.

International Search Report for PCT Application Serial No. PCT/US06/033323, mailed on Aug. 12, 2006.

Miessler G.L. et al. 1999. Chapter 1 *Introduction to Inorganic Chemistry*, 2nd Edition, Chapter 1, Introduction to Inorganic Chemistry, pp. 1-3; Chapter 13, Organometallic Chemistry, pp. 422-424, 442 of Inorganic Chemistry. Upper Saddle River, NJ: Prentice-Hall, 1999 (Aug. 1999 Reprinted Edition).

Peumans P. et al. 2000. American institute of Physics, "Efficient photon harvesting at high optical intensities in ultrathin organic double-heterostructure photovoltaic diodes". Applied Physics Letters, vol. 76, No. 19, May 8, 2000, pp. 2650-2652.

Weaver M.S. et al. 2002. Organic light-emitting devices with extended operating lifetimes on plastic substrates. Applied Physics Letters, vol. 81, No. 16, Oct. 14, 2002, pp. 2929-2931.

* cited by examiner

METHOD OF FORMING AN ENCAPSULATING ELECTRODE

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

1. Field of the Invention

The present invention generally relates to organic photosensitive optoelectronic devices. More specifically, it is directed to organic photosensitive optoelectronic devices having an encapsulating layer.

2. Background

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers, unless it is specified that the first layer is "in physical contact with" the second layer.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices.

"Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

A method is disclosed for forming an organic photosensitive optoelectronic device in which the organic photoconductive materials are encapsulated by an electrode of the device. A first transparent film is provided, comprising a first electrically conductive material arranged on a transparent substrate. A first photoconductive organic material is deposited over the first electrically conductive material. A first metal is deposited at an initial rate of no more than 1 nm/s over said first photoconductive organic material, completely covering any exposed portions of said first photoconductive organic material and any exposed interfaces with said first photoconductive organic material to a thickness of no less than 10 nm. After the thickness of no less than 10 nm is obtained, the second metal is sputtered at an increased rate at least three times the initial rate until a cumulative thickness of the first and second metals completely covering the previously exposed portions of said first photoconductive organic material and the previously exposed interfaces with said first conductive organic material is at least 250 nm.

Techniques for depositing of the first metal at the initial rate of no more than 1 nm/s include sputtering and vacuum thermal evaporation.

If sputtering is employed for the deposition of the first metal, the transition from the initial rate to the increased rate may be performed as a continuous, uninterrupted sputtering process. The transition from the initial sputtering rate to the increased sputtering rate preferably occurs when the thickness of the metal is no more than 30 nm.

The increased rate is preferably in the range of 1 to 10 nm/s. The second metal may be sputtered at the increased rate until the cumulative thickness with the first metal deposited at the initial rate is between 250 nm and 2.5 µm. The first and second metals having the cumulative thickness between 250 nm and 2.5 µm preferably together have a permeability of no more than $5 \times 10^{-6}$ g/m$^2$/day (25° C.) for H$_2$O. More preferably, the permeability is no more than $1 \times 10^{-6}$ g/m$^2$/day (25° C.) for H$_2$O. The metal having the cumulative thickness between 250 nm and 2.5 µm also preferably has a permeability of no more than $5 \times 10^{-6}$ cm$^3$/m$^2$/day/atm (25° C.) for O$_2$. More preferably, the permeability is no more than $1 \times 10^{-6}$ cm$^3$/m$^2$/day/atm (25° C.) for O$_2$.

As a first example of the dimensions encapsulated, the first and second metals and said first photoconductive organic material may each cover a continuous area of not less than 1 cm$^2$. As a second example, the first and second metals and the first photoconductive organic material each cover a continuous area of not less than 10 cm$^2$.

The method may further include depositing and patterning an electrically non-conductive material prior to depositing said first photoconductive organic material. A portion of the first electrically conductive material may extend out from beneath the electrically non-conductive material to provide a wiring contact that is electrically isolated from the first and second metals covering the previously exposed portions of the first photoconductive organic material.

To create an intermediate electrode in a tandem cell, the method may further comprise providing a second electrically conductive material prior to depositing said first photoconductive organic material. The second electrically conductive material is arranged to be electrically isolated from the first electrically conductive material. An electrically non-conductive material is deposited and patterned over the second electrically conductive material prior to depositing said first photoconductive organic material. A second transparent film comprising a third electrically conductive material is deposited over the first photoconductive organic material. A portion of the third electrically conductive material is deposited to be in physical contact with the second electrically conductive material. The third electrically conductive material is deposited to be electrically isolated from the first electrically conductive material. A second photoconductive organic material is deposited over the second transparent film comprising the third electrically conductive material. The first and second metals completely cover any exposed portions of both the first and second photoconductive organic materials and any exposed interfaces with the first and second photoconductive organic materials. The first and second metals covering the previously exposed portions of the first and second photoconductive materials are electrically connected to the first electrically conductive material and is electrically isolated from the second and third electrically conductive materials. The first electrically conductive material and the second electrically conductive material may be a same material.

The method may further comprise depositing a second photoconductive organic material over the first organic material, with the first and second organic materials forming a planar, bulk, or hybrid donor-acceptor heterojunction. The deposited and sputtered metal completely covers any exposed portions of the first and second photoconductive organic materials and any exposed interfaces with the first and second photoconductive organic materials.

The method may further comprise depositing a second photoconductive organic material with the first organic material, with the first and second organic materials forming a mixed, bulk, or hybrid donor-acceptor heterojunction. The deposited and sputtered metal completely covers any exposed portions of the first and second photoconductive organic materials and any exposed interfaces with the first and second photoconductive organic materials.

The method may also form a Schottky-barrier heterojunction composed of the first photoconductive organic material and the deposited and sputtered metal, with the metal serving as the Schottky contact.

As part of the formation of a module composed of side-by-side cells, the method may further comprising shadow-masking during the deposition of the first metal and the sputtering of the second metal to form a plurality of adjacent cells on the transparent substrate, each cell comprising at least one photoactive region including the first photoconductive organic material, the cells being electrically connected in series. Series-connected side-by-cells may also be formed by laser-etching the first metal and/or the second metal A combination of shadow-masking and laser etching may also be used.

The first metal and the second metal may be a same material, or may be different materials.

The figures are not necessarily drawn to scale.

DETAILED DESCRIPTION

Figure 1:
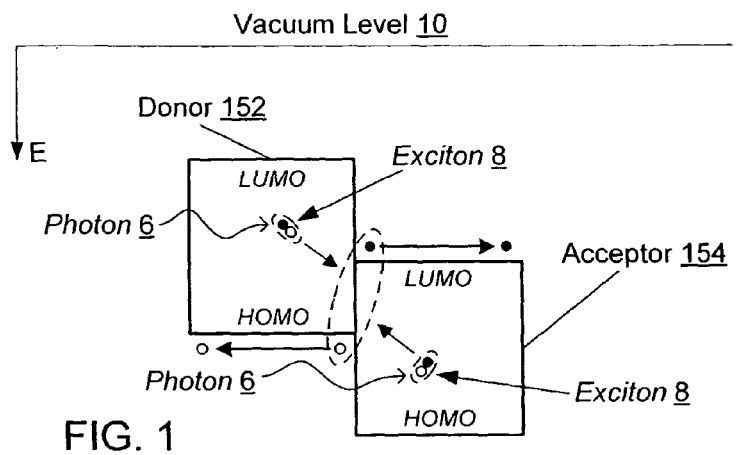
FIG. 1 is an energy level diagram illustrating a donor-acceptor heterojunction.
Figure 2:
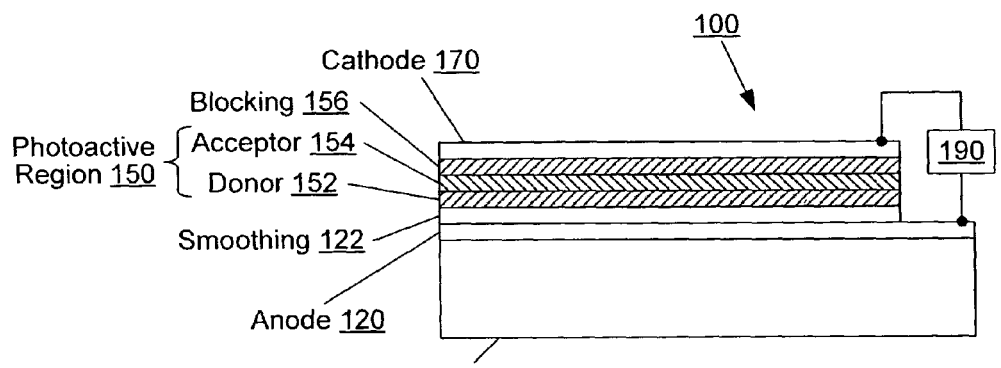
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing and other methods known in the art.

Figure 3:
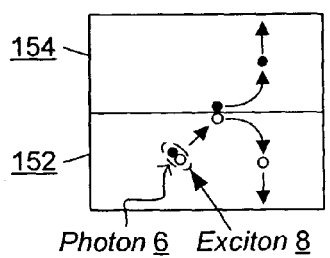
FIG. 3 illustrates a donor-acceptor bilayer forming a planar heterojunction.
Figure 4:
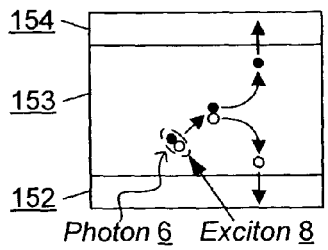
FIG. 4 illustrates a hybrid heterojunction including a mixed heterojunction between a donor layer and an acceptor layer.
Figure 5:
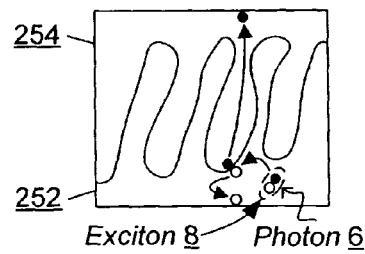
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, U.S. application Ser. No. 10/910,371 entitled "High efficiency organic photovoltaic cells employing hybridized mixed-planar heterojunctions" by Jiangeng Xue et al., filed Aug. 4, 2004, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
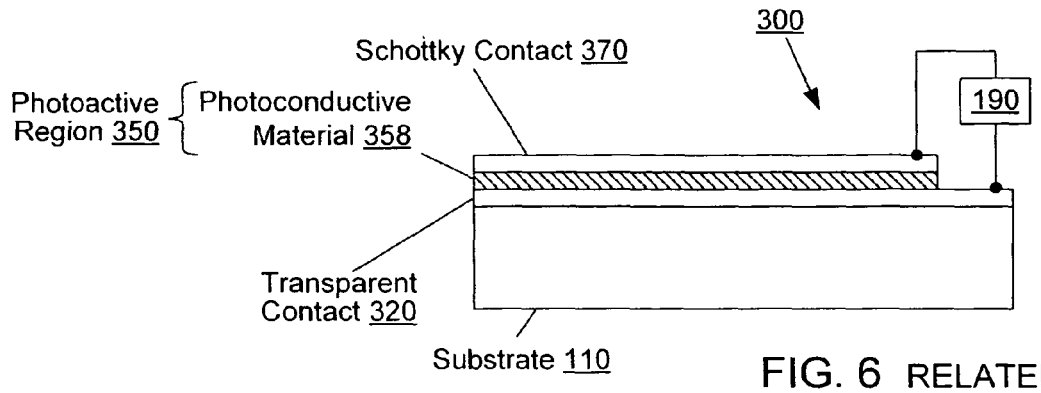
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; U.S. patent application Ser. No. 10/915,410 entitled "Organic Photosensitive Devices" by Rand et al., filed Aug. 11, 2004; and U.S. patent application Ser. No. 10/979,145 entitled "Stacked Organic Photosensitive Devices" by Forrest et al., filed Nov. 3, 2004; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
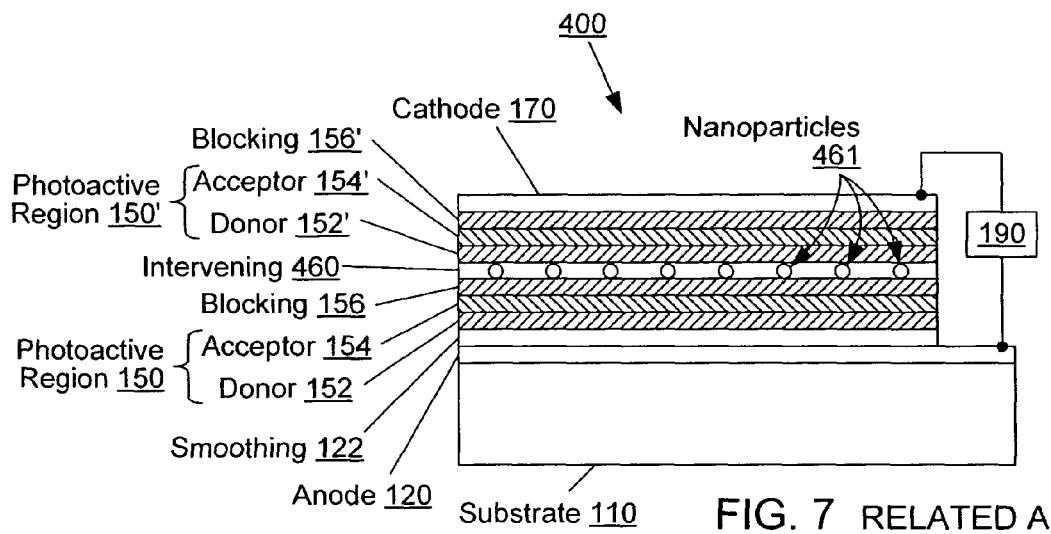
FIG. 7 illustrates tandem photosensitive cells in series.
Figure 8:
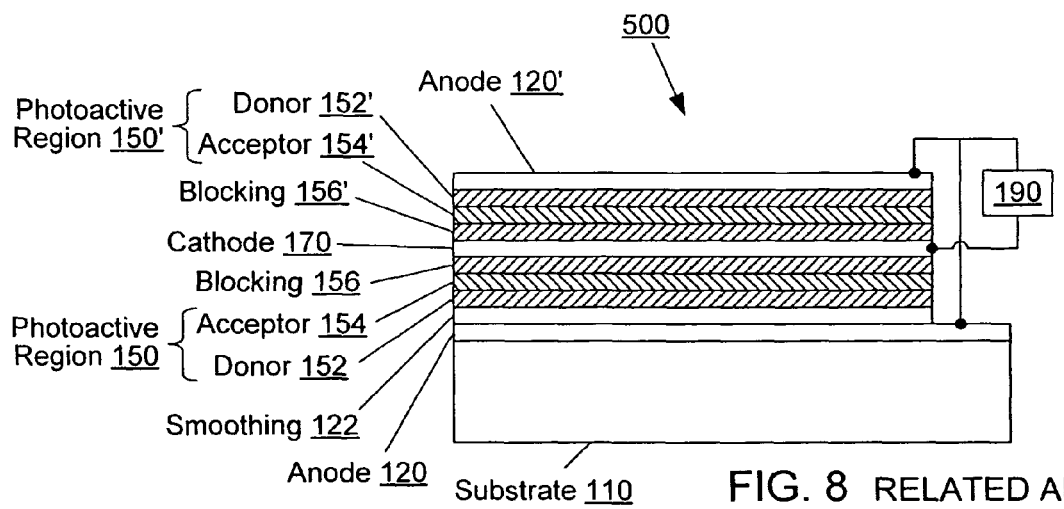
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example, in U.S. patent application Ser. No. 10/857,747 entitled "Aperiodic dielectric multilayer stack" by Peumans et al., filed Jun. 1, 2004, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

The performance of organic semiconductor devices degrade with exposure to oxygen or water. This degradation can result in reduced power conversion efficiency in organic photovoltaic devices. Typically, the organic device is assembled on a substrate on which a transparent conducting oxide has already been provided as a front electrode. A metal back electrode may be applied to the finished device, and then another layer of glass or other material is epoxy-ed over the electrode after an inert gas has been filled into any voids. The entire package might also enclose an absorbent material or desiccant that functions to absorb any oxygen or water vapors that might remain or enter the packaging.

Often the back electrode of an organic photoemissive device is sub-divided due to wiring and spatial needs of the individual components of the specific device. In comparison, for solar cells and photovoltaic devices, the devices may continuously cover a large-area surface, with subdivisions unnecessary or occurring less frequently. But while the wiring of photovoltaic devices tends to be simpler than for photoemissive devices, the resistance of-and-to the electrodes is of greater importance. With a photoemissive device, higher resistance can be overcome, among other ways, by increasing the supply voltage. In comparison, high resistance is crippling to the efficiency and utility of a photovoltaic device.

It would be desirable to seal the organic layers of a photovoltaic device from the elements with fewer process steps. One possibility is to form a back metal electrode to encapsulate the organic photoactive region. Use of vapor deposition in vacuum to form such an electrode tends to produce a thin and somewhat porous electrode, providing poor wide-area coverage as required to hermetically seal the organics in photovoltaics. Another possibility is to use sputtering to form the electrode, but a very slow deposition is required to moderate damage to the underlying organic materials, making the process unrealistic for general manufacturing. In addition to these problems, wide area deposition of thick metal layers may be expensive.

Applicants have found that a slowly grown (0.1 to 1 nm/s) sputtered layer of metal to a thickness of 10 to 30 nm is sufficient to avoid further sputtering-induced damage in the underlying organic materials. While the resulting layer is too thin to hermetically seal the organic materials, it provides a protective barrier, enabling the deposition of a thick layer of the same metal, in the same process chamber, at a much higher rate without damage to the underlying organic materials.

Accordingly, to simplify the process required to encapsulate photovoltaic devices, embodiments of the present invention slowly sputter a metal film to no less than 10 nm over the exposed surfaces of the organic layers of a photosensitive device, and over any interfaces with the organic layers, after which the sputtering rate is increased by at least a factor of three to deposit a thick layer that is substantially impermeable to oxygen and water. The ultimate thickness of the metal can be a few hundred nanometers to a few micrometers, depending upon the permeability rates for $H_2O$ and $O_2$ through the particular metal film. This "encapsulating" electrode hermetically seals the organic layers with a minimum of process steps, while enhancing device lifetime by inhibiting the infiltration of oxygen from $O_2$, $H_2O$ and other contaminants. In addition, the thick metal layer contributes to a lowering of the overall series resistance of the photovoltaic device.

In comparison to metals, the permeability of most metal substitutes make them less suitable for use as an encapsulating electrode.

Figure 9A:
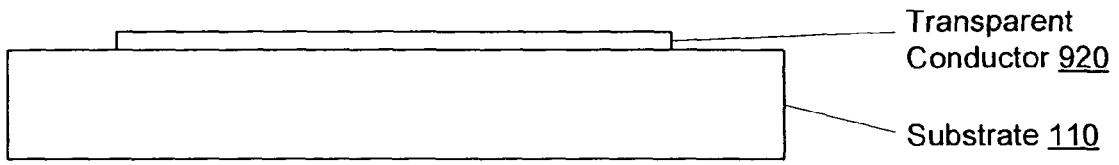
FIGS. 9A-9D illustrate an example process for formation of an encapsulating electrode.
Figure 9B:
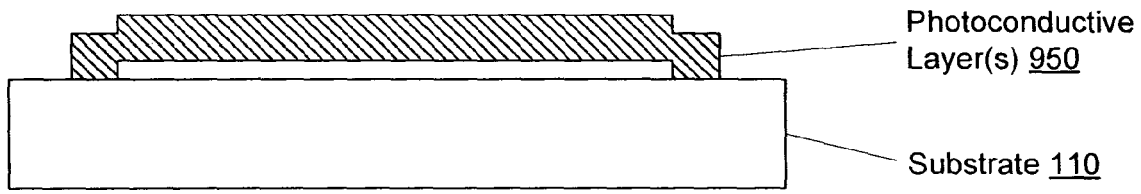

FIGS. 9A-9D illustrate an example of a process for forming an encapsulating electrode. In FIG. 9A, a transparent conductor 920 (e.g., a transparent metal substitute or thin metal layer) is provided on a transparent substrate 110. In FIG. 9B, one or more organic photoconductive layers 950 are deposited. Any of several techniques may be used, including vapor deposition with a shadow mask to control the pattern of the organic layer, or solution delivery of the organic materials via an ink-jet system combined with a solvent evaporation step. The photoconductive layers may be arranged to form one-or-more donor-acceptor heterojunctions (e.g., arranged as described herein with FIGS. 2-5), or a Schottky-barrier heterojunction (e.g., arranged as described herein with FIG. 6). Other layers may be included with the heterojunction layer(s), such as an exciton blocking layer 156/156' and an intervening conductive region 460 (FIG. 7).

Figure 9C:
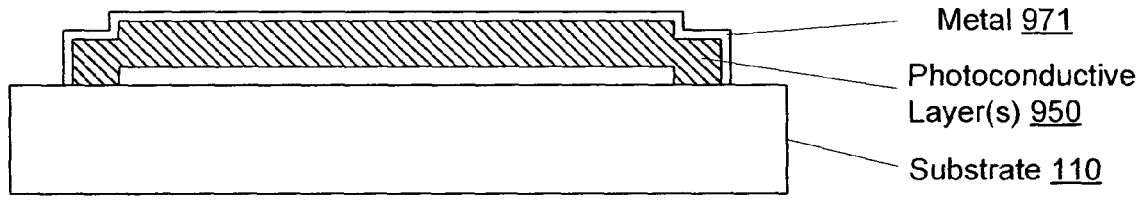

In FIG. 9C, a metal 971 is uniformly deposited by sputtering over an entirety of the exposed surfaces and interfaces of the photoconductive layer(s) 950 at a rate of no more than 1 nm/s, to a thickness of at least 10 nm. Preferably, the rate is between 0.1 to 1 nm/s and the target thickness is between 10 and 30 nm. If the resulting device is a photovoltaic, a photoconductor or a photodetector, the area coated by the metal 971 will usually have a lower bound 0.1 cm$^2$, or even 0.01 cm$^2$, whereas for a large area photovoltaic device, the area coated by the metal 971 will be at least 1 cm$^2$ or larger. For photovoltaic devices, larger areas are preferred because it simplifies manufacturing, lowers costs, and enhances device lifetime by reducing interfaces with the external environment. For example, a continuous area covered by the photoconductive layer(s) 950 in a solar cell may exceed 10 cm$^2$, such that the area covered by metal 971 is at least 10 cm$^2$.

Figure 9D:
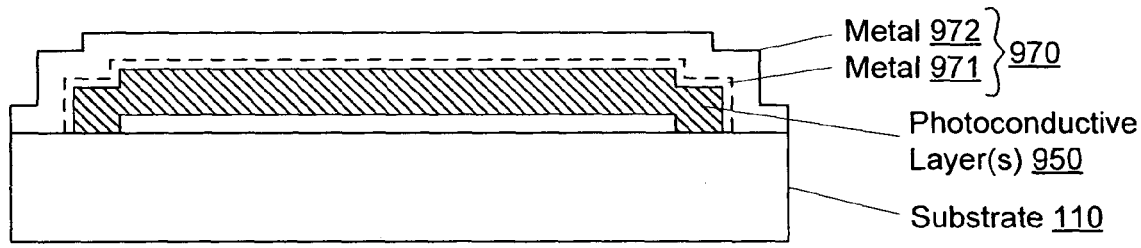

In FIG. 9D, after the target thickness is reached, the rate of deposition is increased by at least 3 times to deposit metal 972, until the combination (970) of the slow-deposited (971) and the fast-deposited (972) metal reaches a thickness of at least 250 nm. Preferred growth rates for metal layer 972 are in the range of 1 to 10 nm/s.

The ultimate thickness of the metal 970 depends upon the permeability rate of $H_2O$ and $O_2$, for the particular metal, as grown at the particular deposition rates, but is preferably between 250 nm and 2.5 μm. Permeability through layer 970 is preferably no more than $5\times10^{-6}$ g/m$^2$/day (25° C.) for $H_2O$, and more preferably, no more than $1\times10^{-6}$ g/m$^2$/day (25° C.) for $H_2O$. Permeability through layer 970 is also preferably no more than $5\times10^{-6}$ cm$^3$/m$^2$/day/atm (25° C.) for $O_2$, and more preferably, no more than $1\times10^{-6}$ cm$^3$/m$^2$/day/atm (25° C.) for $O_2$.

The external electrical connection to transparent conductor 920 in the finished device, as shown in FIG. 9D, may be formed through (or embedded in) the substrate, which is described further below.

Figure 10A:
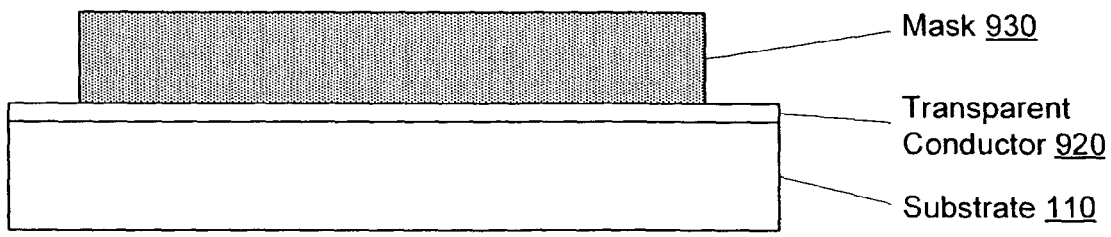
FIGS. 10A-10H illustrate further steps added to the example process in FIGS. 9A-9D for formation of an encapsulating electrode.
Figure 10B:
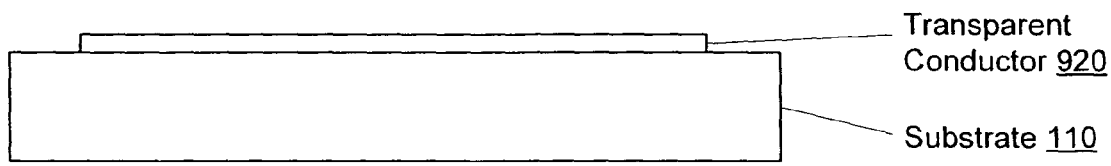
Figure 10C:
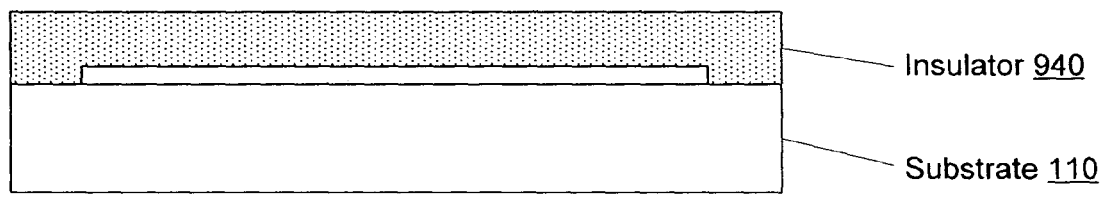
Figure 10D:
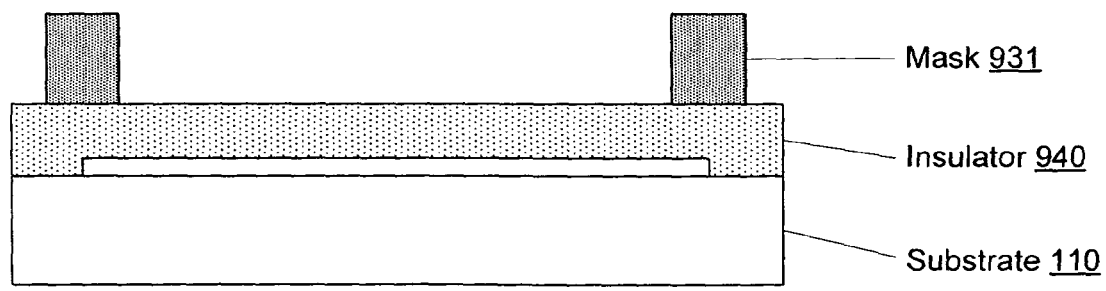
Figure 10E:
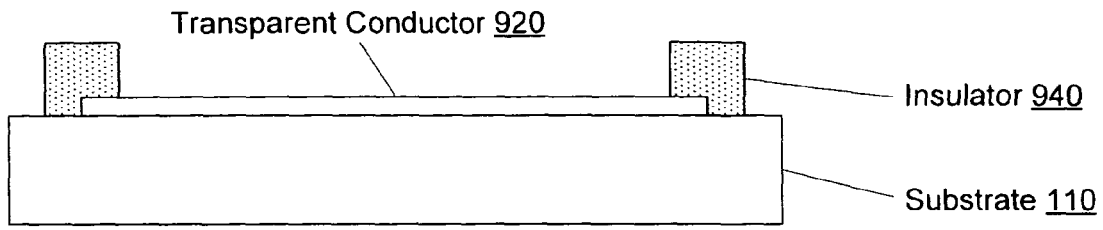

FIGS. 10A-10H illustrate the example of the process for forming an encapsulating electrode in FIGS. 9A-9D, but incorporating additional steps. In FIG. 10A, a first sacrificial mask 930 (e.g., photoresist) is patterned on a transparent substrate 110 coated with a transparent conductor 920 (e.g., a transparent metal substitute or thin metal layer). In FIG. 10B, the transparent conductor 920 is then etched back. In FIG. 10C, an electrically non-conducting material 940 is deposited. Any material that is relatively impermeable to $O_2$ and $H_2O$ may be used as the electrically non-conducting material 940. A preferred example is silicon nitride, which can be deposited by plasma-enhanced chemical vapor deposition. In FIG. 10D, a second sacrificial mask 931 is patterned over the non-conducting material 940, followed by etching of the underlying non-conducting material 940, to create a pattern such as the one shown in FIG. 10E.

The non-conducting material 940 may be used for, among other things, providing a barrier between the encapsulating electrode and an underlying electrode so as to create an external wiring path to the underlying electrode. Examples of such configurations appear below.

Figure 10F:
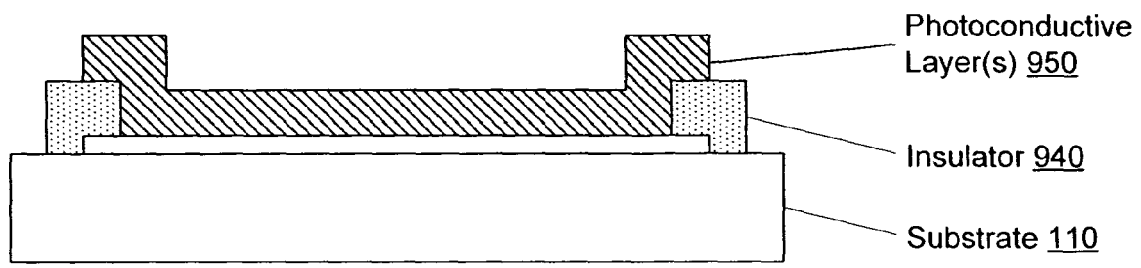

In FIG. 10F, one or more organic photoconductive layers 950 are deposited in a same step as described with FIG. 9B. Any of several techniques may be used, including vapor deposition with a shadow mask to control the pattern of the organic layer, or solution delivery of the organic materials via an ink-jet system combined with a solvent evaporation step. The photoconductive layers may be arranged to form one-or-more donor-acceptor heterojunctions (e.g., arranged as described herein with FIGS. 2-5), or a Schottky-barrier heterojunction (e.g., arranged as described herein with FIG. 6). Other layers may be included with the heterojunction layer(s), such as an exciton blocking layer 156 and an intervening conductive region 460 (FIG. 7).

Figure 10G:
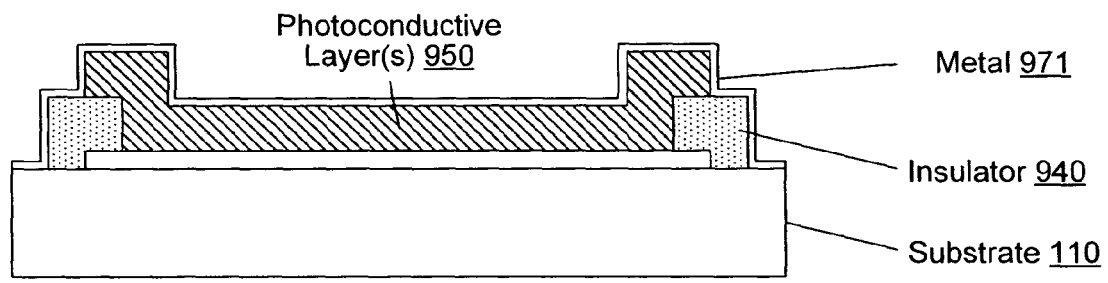

In FIG. 10G, in the same step described with FIG. 9C, a metal 971 is uniformly deposited by sputtering over an entirety of the exposed surfaces and interfaces of the photoconductive layer(s) 950 at a rate of no more than 1 nm/s, to a thickness of at least 10 nm. Preferably, the rate is between 0.1 to 1 nm/s and the target thickness is between 10 and 30 nm. If the resulting device is a photovoltaic, a photoconductor or a photodetector, the area coated by the metal 971 will usually have a lower bound 0.1 cm$^2$, or even 0.01 cm$^2$, whereas for a large area photovoltaic device, the area coated by the metal 971 will usually be at least 1 cm$^2$ or larger. For example, a continuous area covered by the photoconductive layer(s) 950 in a solar cell may exceed 10 cm$^2$, such that the area covered by metal 971 is at least 10 cm$^2$.

Figure 10H:
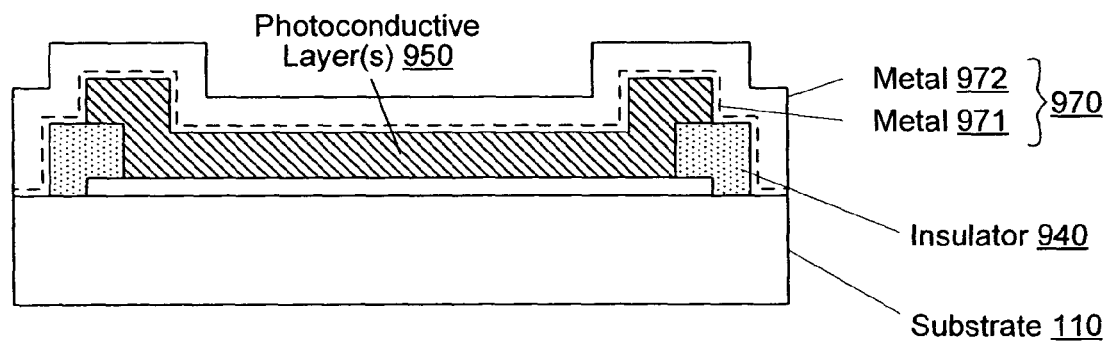
Figure 11:
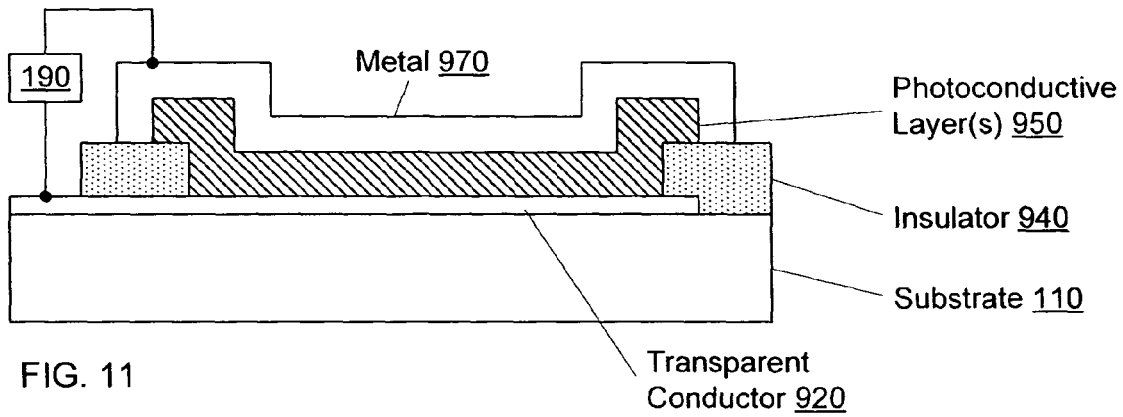
FIGS. 11-19 illustrate an assortment of device cross-sections including the encapsulating electrode.
Figure 12:
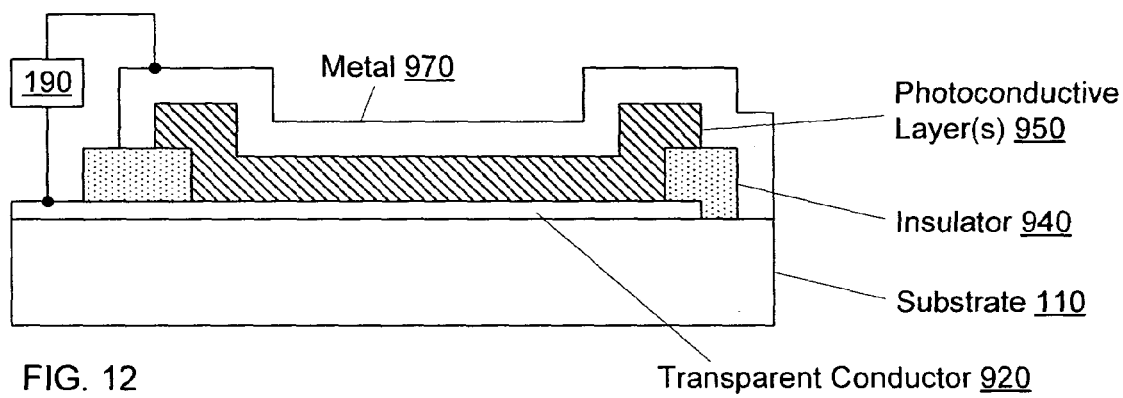
Figure 13:
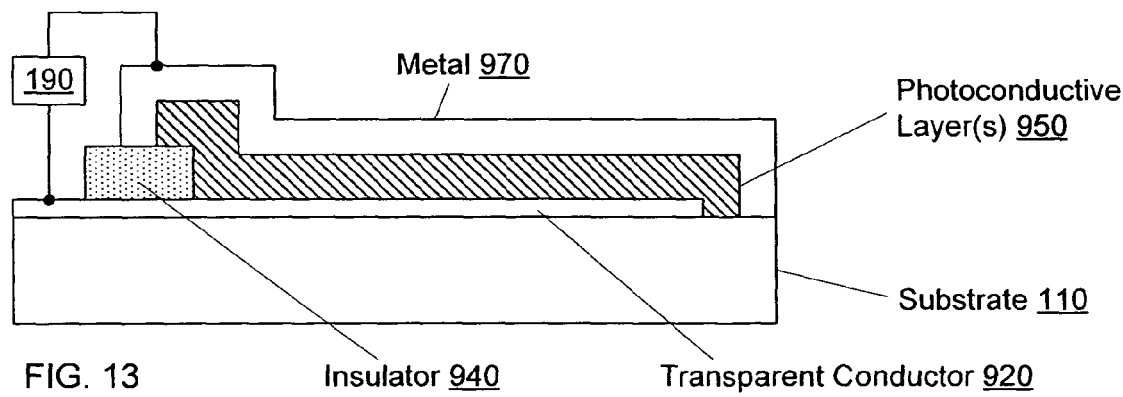
Figure 14:
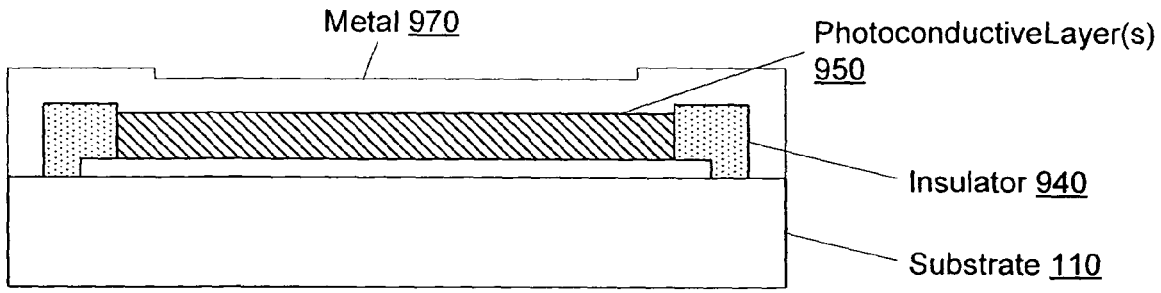
Figure 15:
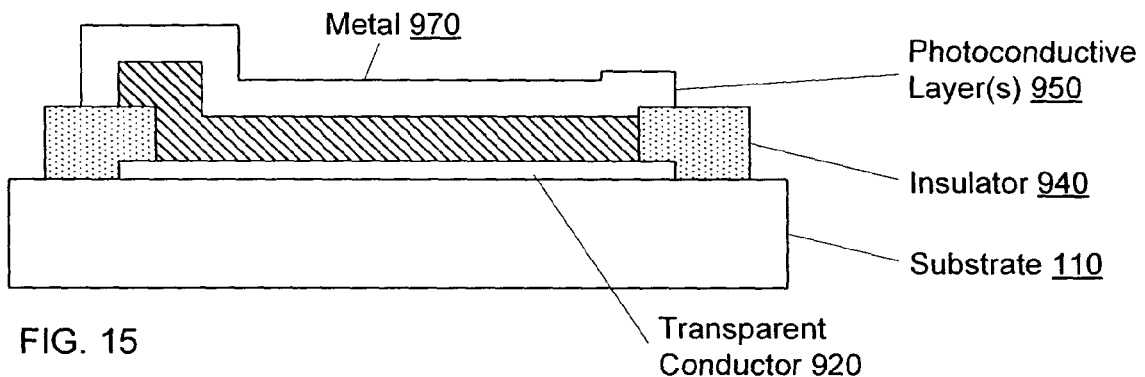
Figure 16:
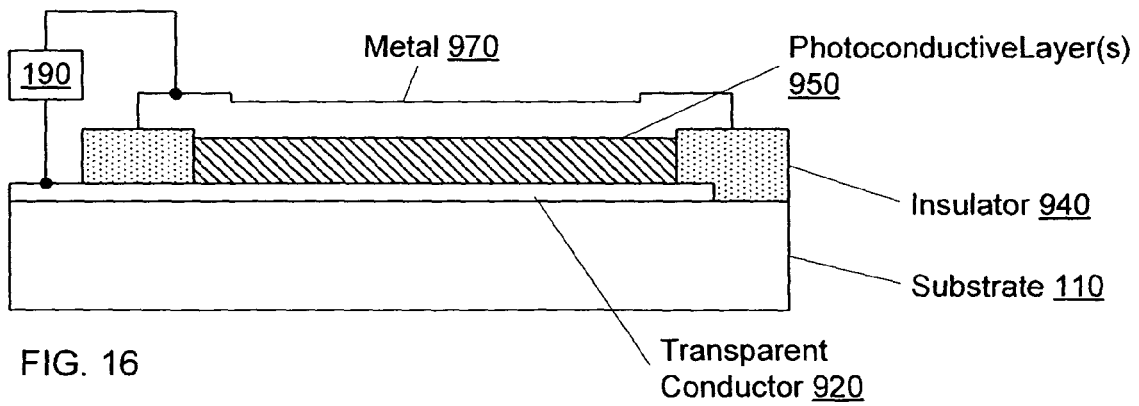
Figure 17:
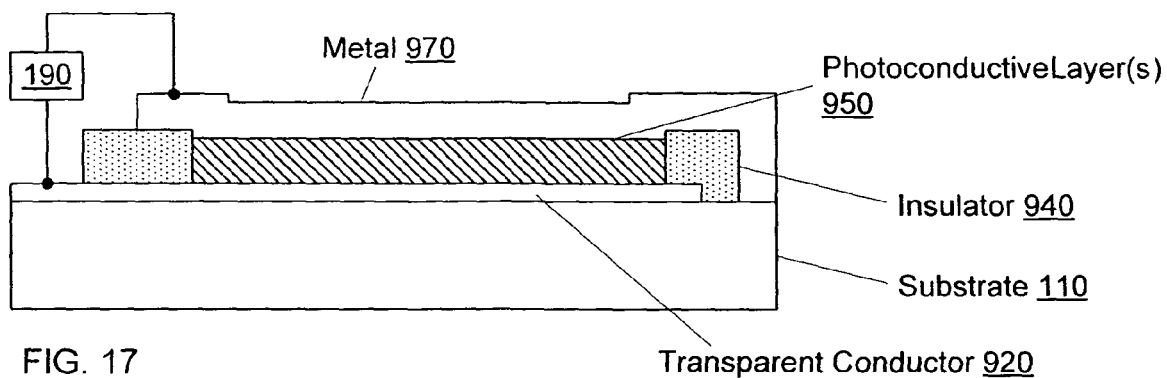
Figure 18:
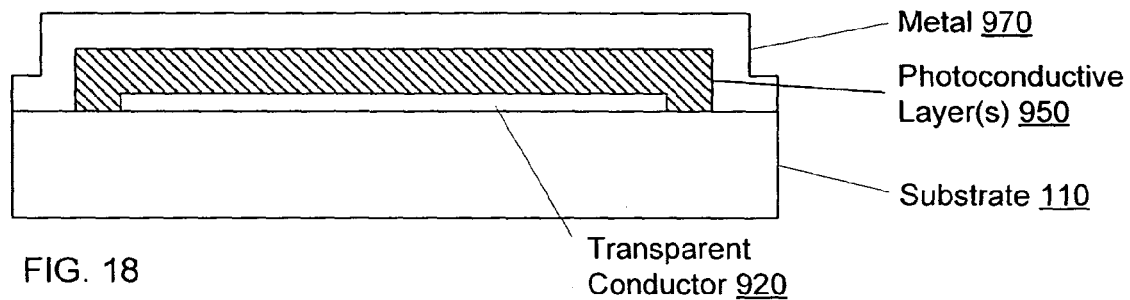
Figure 19:
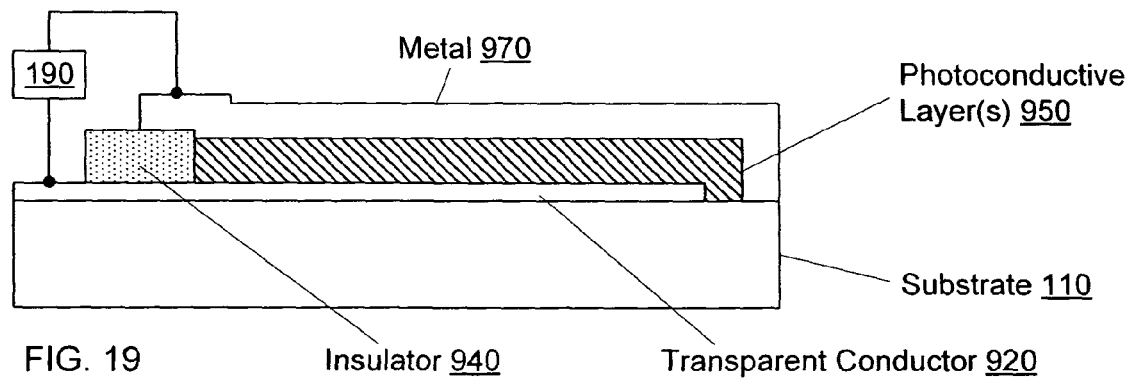

In FIG. 10H, as described with FIG. 9D, after the target thickness is reached, the rate of deposition is increased by at least 3 times to deposit metal 972, until the combination (970) of the slow-deposited (971) and the fast-deposited (972) metal reaches a thickness of at least 250 nm. Preferred growth rates for metal layer 972 are in the range of 1 to 10 nm/s.

As described above, the ultimate thickness of the metal 970 depends upon the permeability rate of $H_2O$ and $O_2$, for the particular metal, as grown at the particular deposition rates, but is preferably between 250 nm and 2.5 µm. Permeability through layer 970 is preferably no more than $5 \times 10^{-6}$ g/m$^2$/day (25° C.) for $H_2O$, and more preferably, no more than $1 \times 10^{-6}$ g/m$^2$ day (25° C.) for $H_2O$. Permeability through layer 970 is also preferably no more than $5 \times 10^{-6}$ cm$^3$/m$^2$/day/atm (25° C.) for $O_2$, and more preferably, no more than $1 \times 10^{-6}$ cm$^3$/m$^2$/day/atm (25° C.) for $O_2$.

Thereafter, the device may be finished with wiring and/or secondary packaging such as plastic or epoxy to provide additional mechanical protection.

The device cross-section illustrated in FIG. 10H is only an example cross-section of a device including the steps for depositing the non-conducting material 940, and many other profiles are possible. Examples of other cross-sections are shown in FIGS. 11 to 19. Several of these cross sections may be combined in a single device, depending upon the pattern used for non-conducting material 940. For example, a device may have one of the illustrated cross-sections in one direction, and may have another of the illustrated cross-sections in the perpendicular direction.

An external electrical connection to the transparent conductor 920 forming the bottom electrode in the finished device may be provided as shown, for example, in FIGS. 11-13, 16, 17, and 19, or may be formed through (or embedded in) the substrate, which is described further below.

With regard to the cross-sections illustrated in FIGS. 10-19, whether the organic photoconductive layers 950 overlap or abut the insulator 940 is not particularly important and depends upon the method used to deposit the organic materials.

With regard to the cross-sections illustrated in FIGS. 9-19, a shadow mask may be used to mask deposition of metals 971 and 972 in regions peripheral to the photoconductive layer(s) 950 (for example, compare metal 971 in FIG. 9C with metal 971 in FIG. 10G. If the organic photoconductive layer(s) 950 form part of a Schottky-barrier photoactive region 350, then metal 970 may be the Schottky contact.

While single cell photosensitive devices and series-stacked photosensitive devices are easily formed using the above described methods and structures (since there are no intermediate electrodes), adding an encapsulating electrode to a parallel tandem device like that shown in FIG. 8 requires additional process steps, since the intermediate electrode(s) requires an electrical connection external to the encapsulated stack. Once deposition of organic layers begin, it is preferable to avoid patterning steps using ultraviolet light (e.g., photolithography), etchants and the like, which can damage organic molecules. Accordingly, patterning steps that require such processes are preferably carried out prior to the deposition of the first organic layer.

FIG. 20A-20G and 21A-21I illustrate processes for forming a parallel tandem cell, similar to the design shown in FIG. 8, but adding an encapsulating electrode. Sacrificial masks are omitted from these figures for brevity, but the patterning processes are otherwise the same as described above. Likewise, the materials, composition of layers, deposition methods, growth rates, thicknesses, and permeabilities are the same as described above.

Figure 20A:
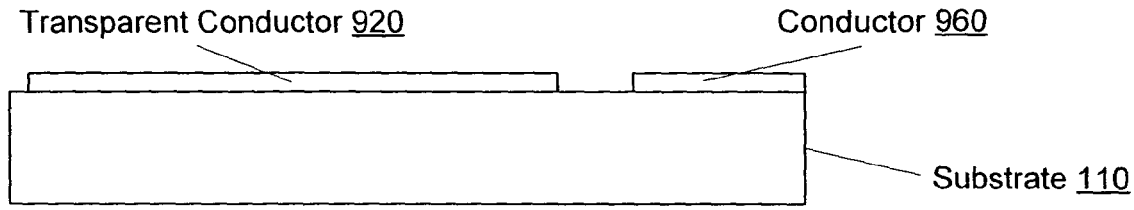
FIGS. 20A-20G illustrate an example process for forming a parallel tandem cell including the encapsulating electrode.

FIG. 20A illustrates a transparent substrate 110 provided with a patterned transparent film comprising the electrically conductive material 920 and with an electrically conductive material 960. The electrically conductive material 960 may be either a metal or a metal substitute, and may or may not be transparent. The most economical process is for materials 920 and 960 to be a same transparent electrically conductive material, simultaneously deposited and patterned. In any case, the conductors identified as 920 and 960 are patterned/formed so that there is no electrical connection between them.

Figure 20B:
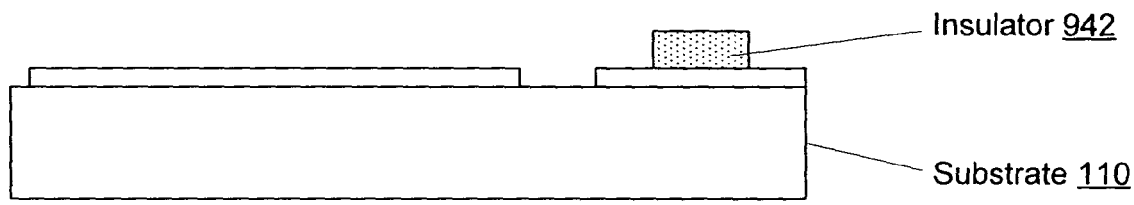

In anticipation of forming an external contact for the intermediate electrode, the electrically non-conductive material 942 is deposited and patterned over the electrically conductive material 960, as shown in FIG. 20B. Any material that is relatively impermeable to $O_2$ and $H_2O$ may be used as the electrically non-conductive material 942. A preferred example is silicon nitride, which can be deposited by plasma-enhanced chemical vapor deposition.

Figure 20C:
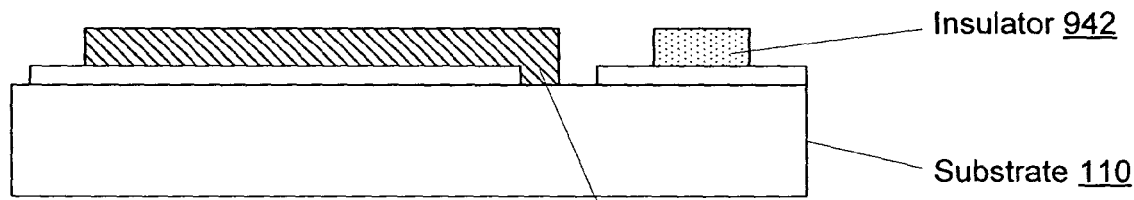
Figure 20D:
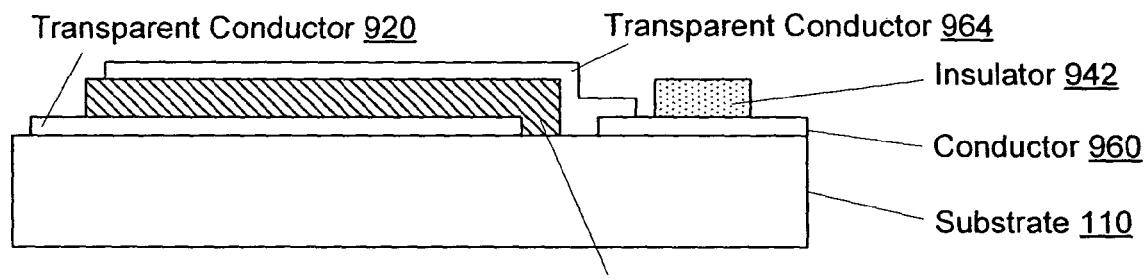

In FIG. 20C, photoconductive layer(s) 950 are formed. In FIG. 20D, a transparent electrically conductive material 964 is deposited so as to form an electrical connection with conductor 960, without contacting transparent conductor 920. Transparent conductor 964 may either be a metal substitute or a thin metal film.

Figure 20E:
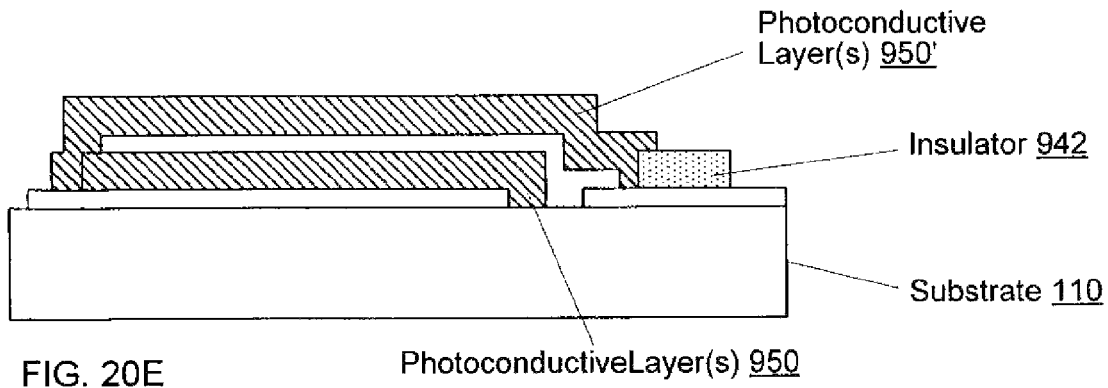
Figure 20F:
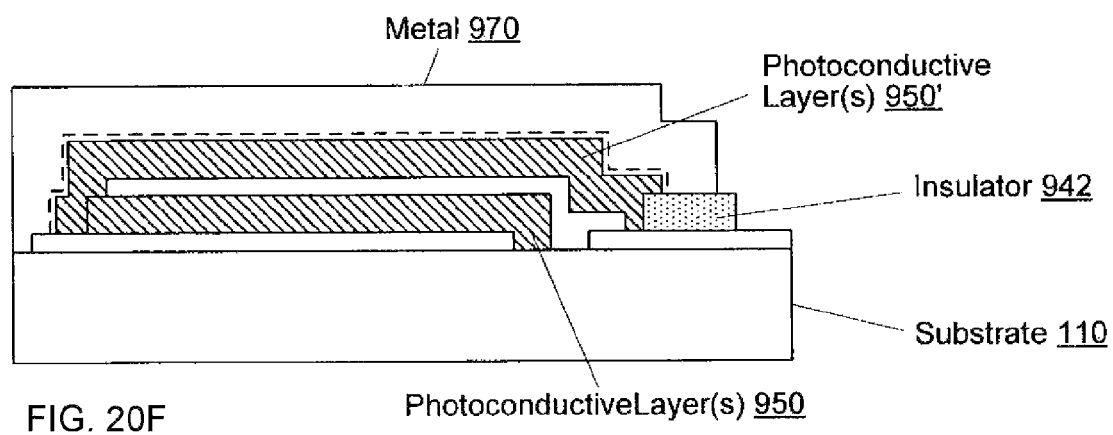
Figure 20G:
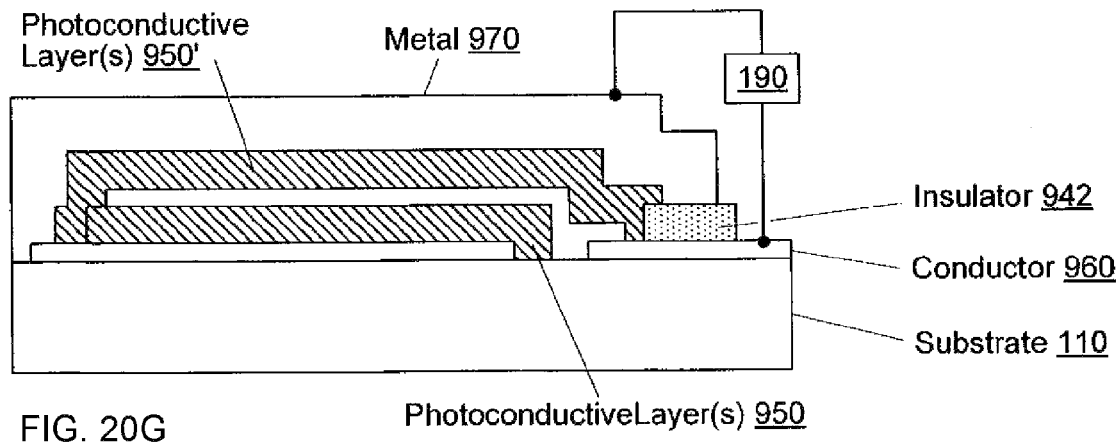

In FIG. 20E, the second set of photoconductive layer(s) 950' are deposited. In FIG. 20F, metal 970 is deposited using the two-step (971/972) sputtering process described above, encapsulating the photoconductive layers 950 and 950', while being electrically isolated from conductors 960 and 964. In this example, the metal 970 forms an electrical connection to transparent conductor 920, thereby forming a common electrode. FIG. 20G illustrates the resulting device in a circuit, connected to element 190.

FIG. 21A-21I illustrate another process for forming a parallel tandem cell, similar to the design shown in FIG. 8, but adding an encapsulating electrode. The difference with the process in FIGS. 20A-20F is the inclusion of additional steps to form the external contact for the intermediate electrode.

Figure 21A:
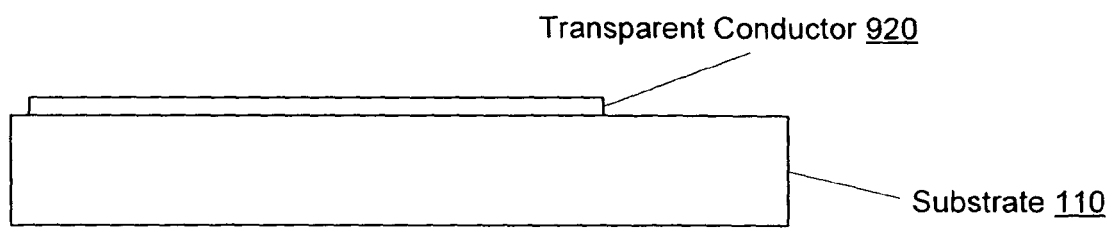
FIGS. 21A-21I illustrate further steps added to the example process in FIGS. 20A-20F for forming a parallel tandem cell including the encapsulating electrode
Figure 21B:
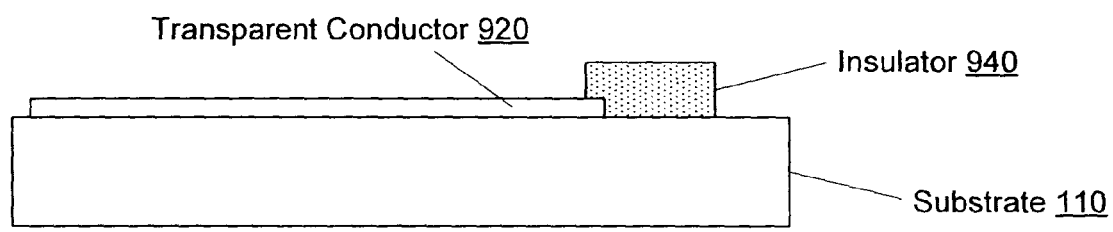
Figure 21C:
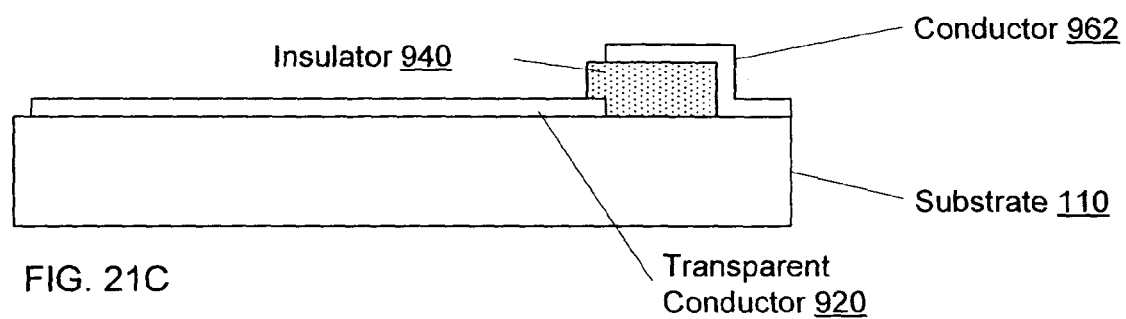

FIG. 21A illustrates a transparent substrate 110 provided with a patterned transparent film comprising the electrically conductive material 920. As shown in FIG. 21B, in anticipation of forming the intermediate electrode, the electrically non-conducting material 940 is deposited and patterned. In FIG. 21C, an electrically conductive material 962 is deposited over the electrically non-conducting material 940, using (for example) a shadow mask or a sacrificial layer to control coverage. The electrically conductive material 962 may be either a metal or a metal substitute, and may or may not be transparent. The conductors identified as 920 and 962 are patterned/formed so that there is no electrical connection between them.

Figure 21D:
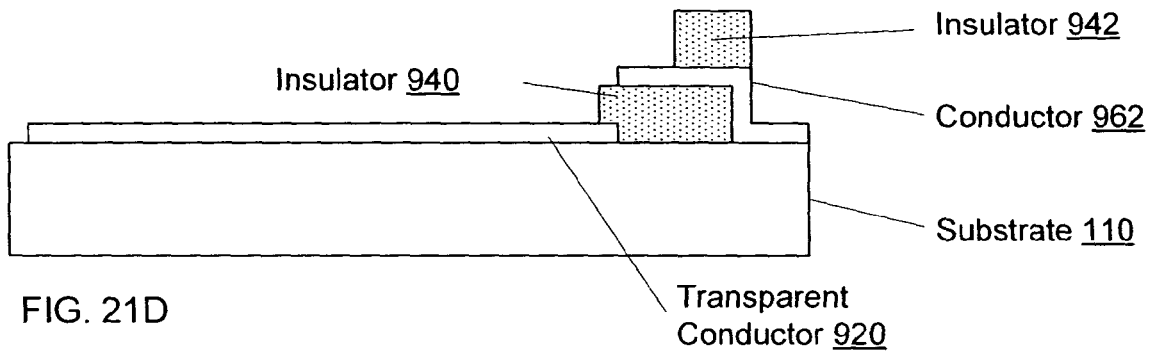
Figure 21E:
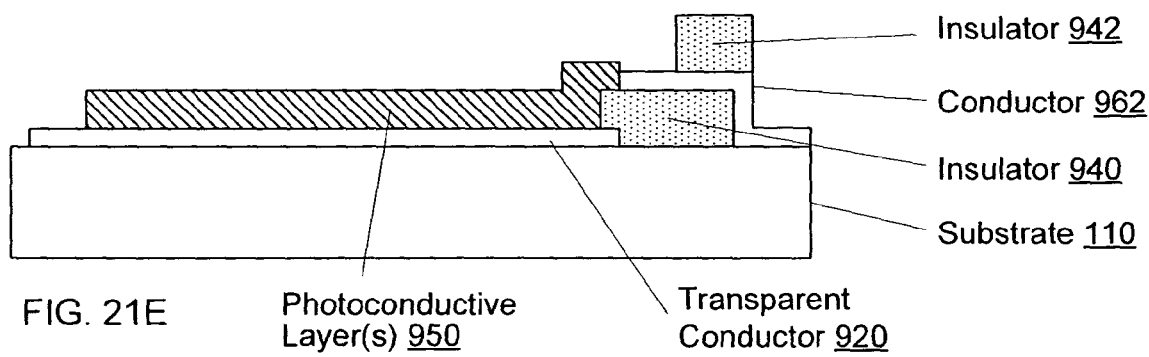
Figure 21F:
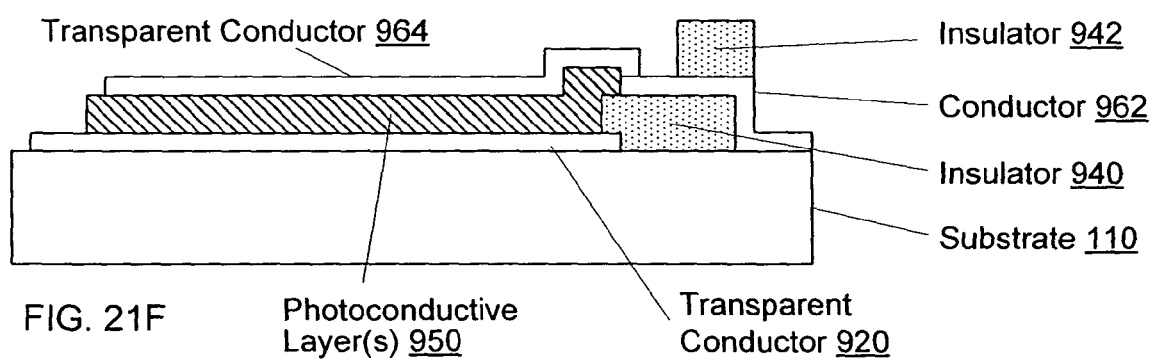

In FIG. 21D, another electrically non-conductive material 942 is deposited and patterned. As described with FIG. 20B, any material that is relatively impermeable to $O_2$ and $H_2O$ may be used as the electrically non-conducting material 942. A preferred example is silicon nitride, which can be deposited by plasma-enhanced chemical vapor deposition. In FIG. 21E, photoconductive layer(s) 950 are formed. In FIG. 21F, a transparent conductor 964 is deposited so as to form an electrical connection with conductor 962, without contacting transparent conductor 920. Transparent conductor 964 may either be a metal substitute or a thin metal film.

Figure 21G:
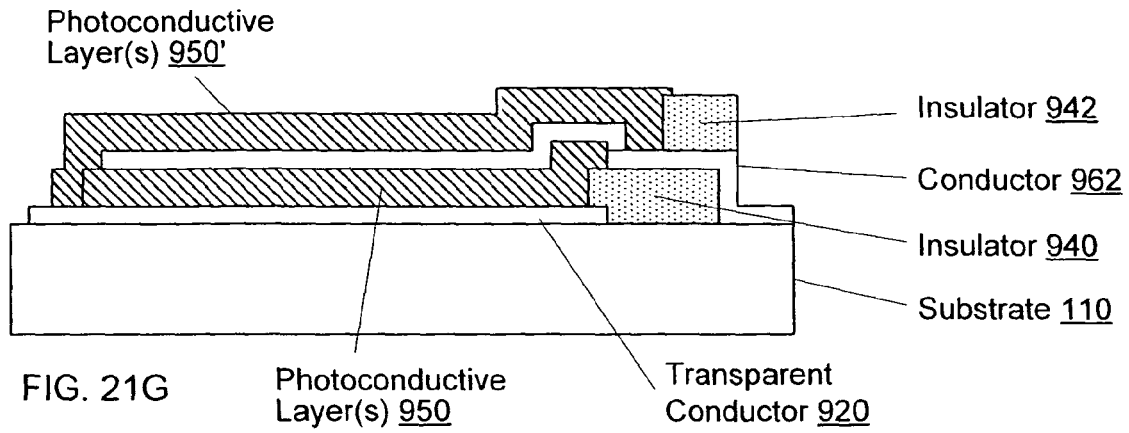
Figure 21H:
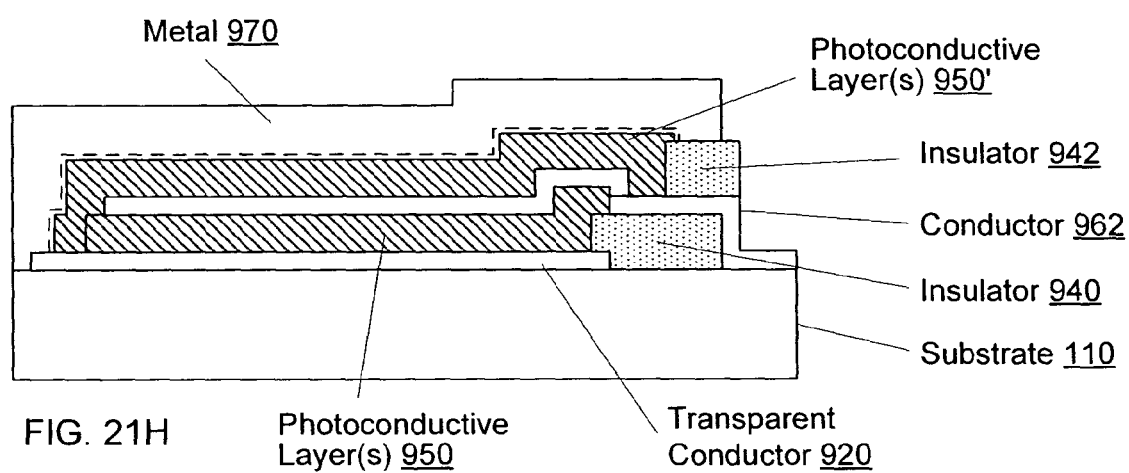
Figure 21I:
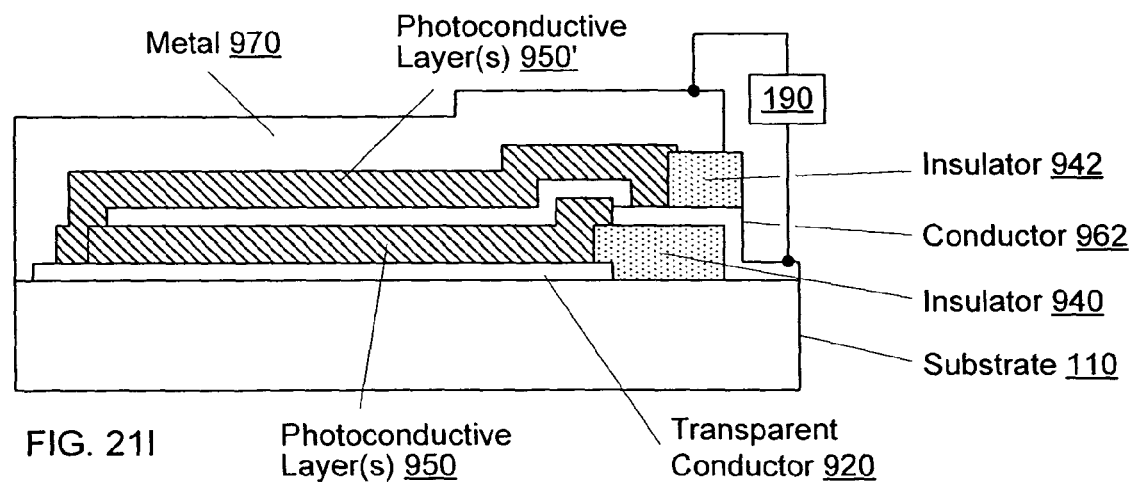
Figure 22:
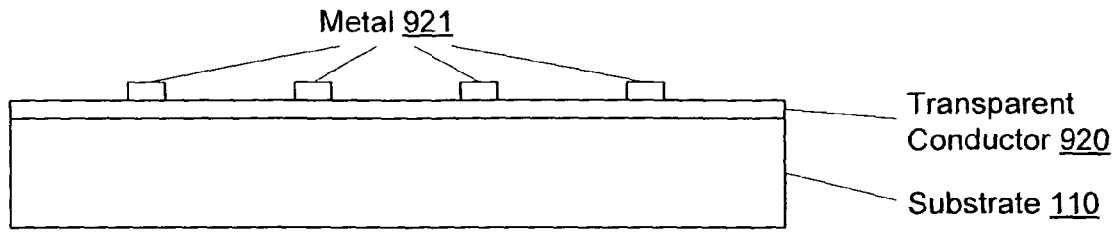
FIGS. 22-25 illustrate an assortment of additional structures that may be formed or provided for the bottom electrode in conjunction with the processes in FIGS. 9-25.
Figure 23:
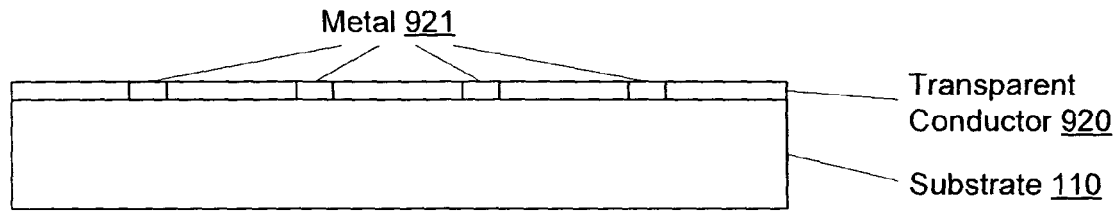
Figure 24:
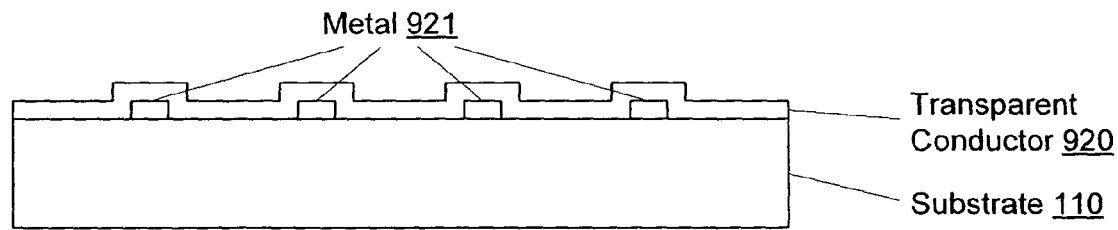
Figure 25:
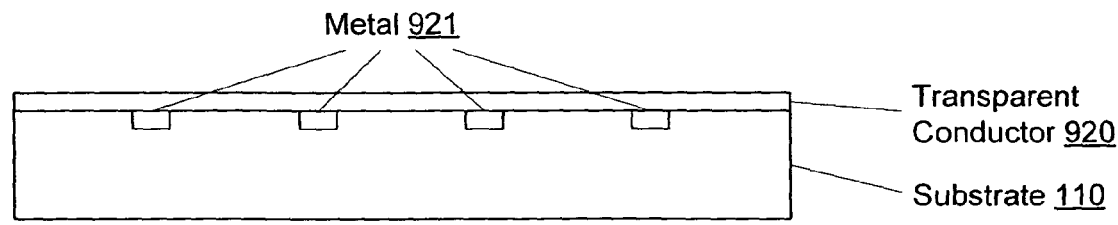

In FIG. 21G, the second set of photoconductive layer(s) 950' are deposited. In FIG. 21H, metal 970 is deposited using the two-step sputtering process (971/972) described above, encapsulating the photoconductive layers 950 and 950', while being electrically isolated from conductors 962 and 964. In this example, the metal 970 forms an electrical connection to transparent conductor 920, thereby forming a common electrode. FIG. 21G illustrates the resulting device in a circuit, connected to element 190.

FIGS. 22 to 25 illustrate various bottom electrode configurations that can be used with each of the above devices in order to lower the sheet resistance of the bottom electrode. In each of these examples, narrow metal lines 921 are added to the bottom electrode. In addition to lowering sheet resistance, the metal lines 921 may be used to enhance encapsulation if transparent conductor 920 is a metal substitute which is more permeable to $O_2$ and $H_2O$ than the metal lines 921. In particular, if the conductor 920 is a metal substitute, a width of the insulator 940 needs to be wider then would be required if the conductor were metal to assure that $O_2$ and $H_2O$ will not infiltrate the device via the metal substitute. However, increasing the width of the insulator 940 reduces the surface area available for photoconduction. By patterning/etching back the transparent conductor 920 to within the margins of the insulator 940 and the encapsulating electrode 970, and instead relying on the metal lines 921 to form the external connection for the bottom electrode, the width of the insulator 940 can be reduced, thereby increasing the area available for photoconduction.

Figure 26A:
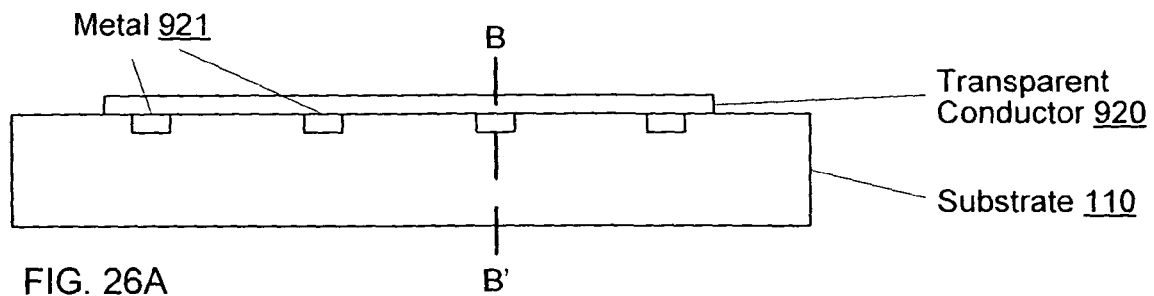
FIGS. 26A-26C illustrate a substrate with an embedded electrical connection to the bottom electrode that may used in conjunction with the processes in FIGS. 9-25.
Figure 26B:
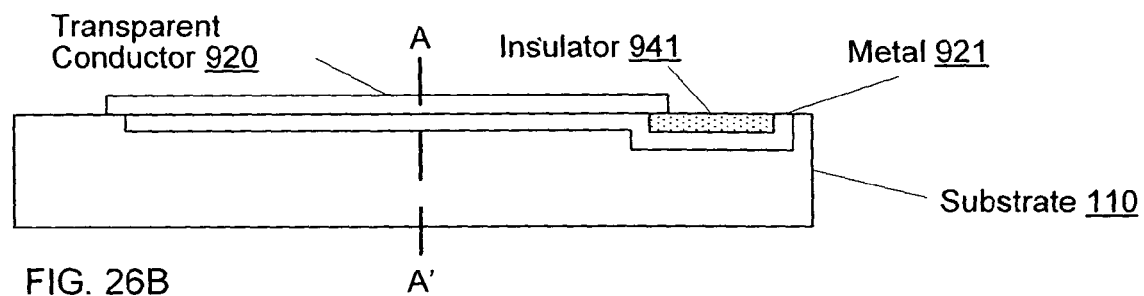
Figure 26C:
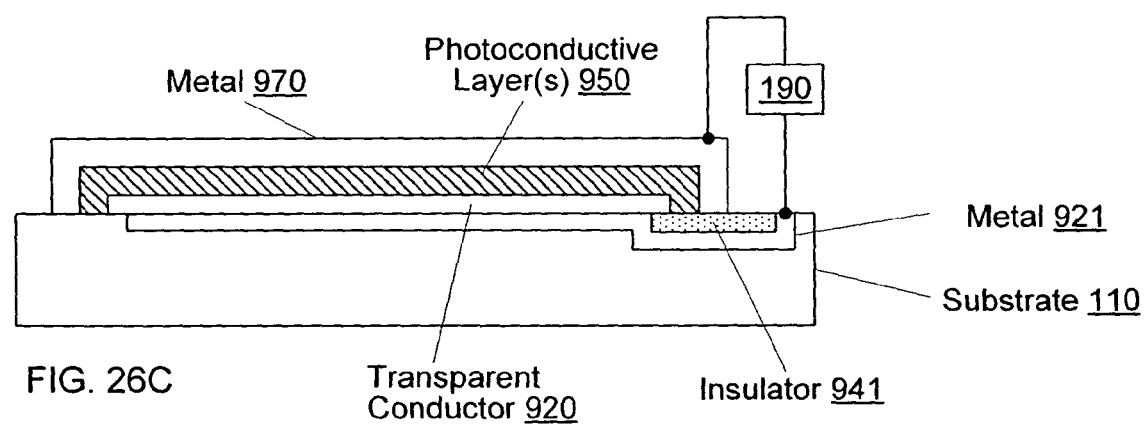

In each of the above examples, an external electrical connection to each electrode is needed to make the finished device operational. As demonstrated by the cross-sections in FIGS. 11, 12, 13, 16, 17, and 19, one way a connection can be made to the bottom electrode 920, 921 is by depositing an insulator 940 over a portion of the bottom electrode 920, 921 to create an electrical contact that is electrically isolated from the encapsulating electrode 970. Another solution is to make the electrical connection to the bottom electrode through the transparent substrate 110, or by embedding a conductive pathway in the substrate 110. FIGS. 26A-26C illustrate an example.

FIG. 26A is a cross-section of the structure along line A-A' shown in FIG. 26B, and FIG. 26B is a cross-section of the structure along line B-B' shown in FIG. 26A. A metal line is embedded in the substrate 110, covered with an electrically non-conductive material 941. If the substrate 110 is plastic, examples of the electrically non-conductive material 941 may include the same plastic material forming the substrate 110 or a conventional insulator such as silicon nitride. If the substrate 110 is glass, examples of the non-conductive material 941 may include glass or a conventional insulator such as silicon nitride. FIG. 26C is an example encapsulated device having the connection to embedded in the substrate, relying on the metal lines 921 to provide the external connection to the element 190. Although this example embeds a metal line 921 in the substrate, a portion of the transparent conductor 920 may also be embedded with or without metal line 921.

Figure 27:
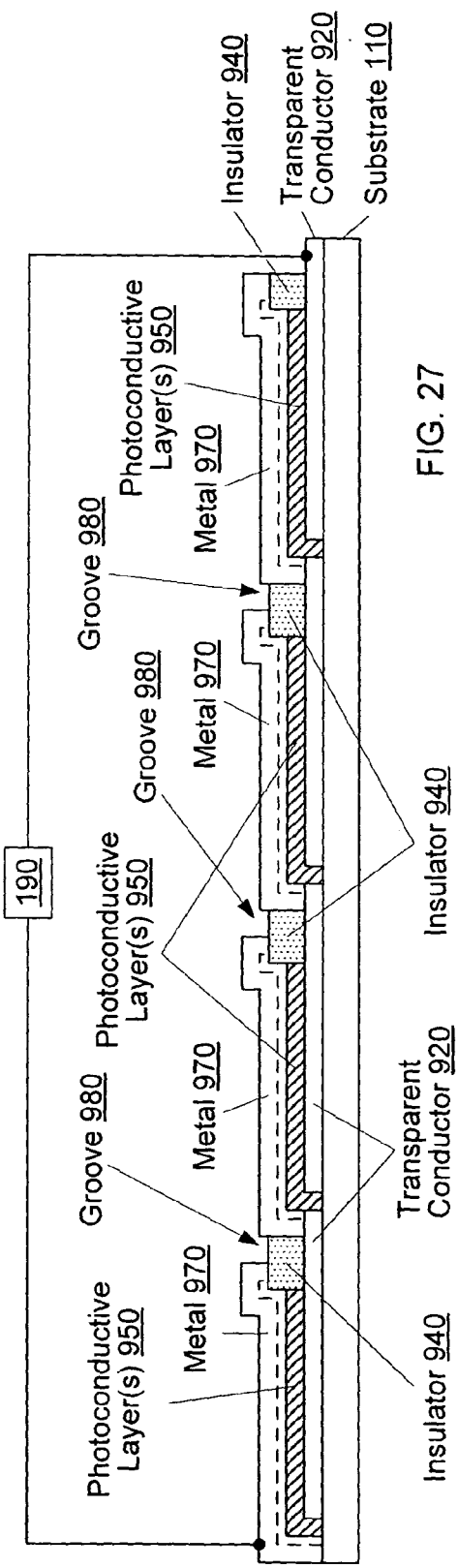
FIGS. 27-29 illustrate examples of multi-cell modules electrically connected in series that may be composed in conjunction with the processes and structures in FIGS. 9-26.
Figure 28:
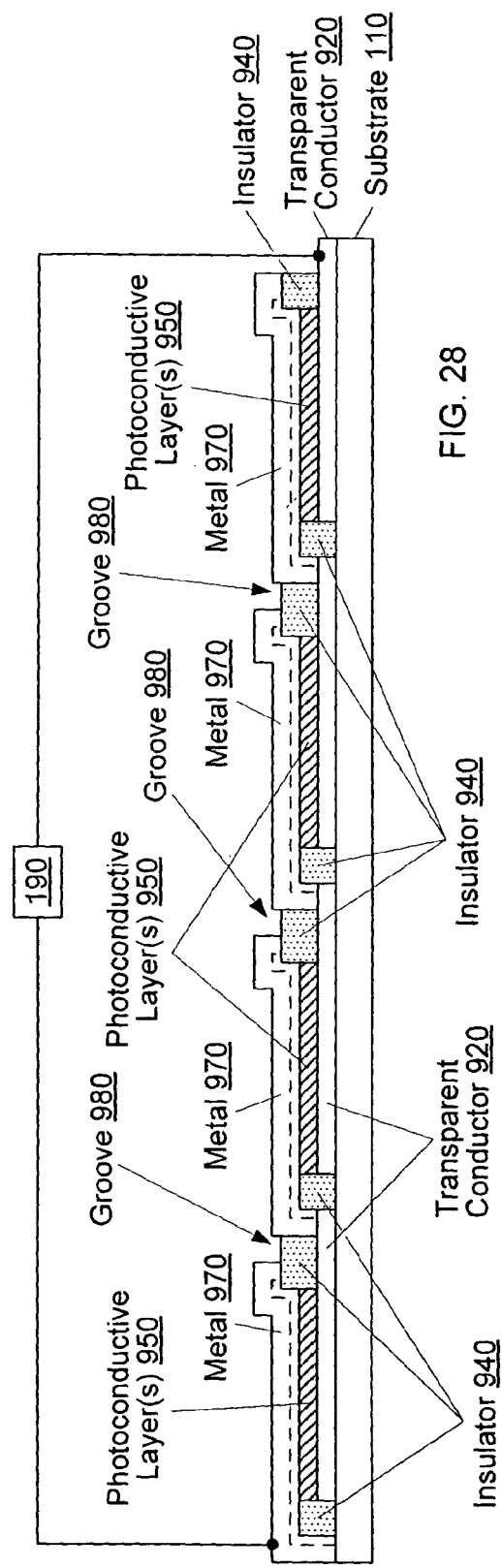
Figure 29:
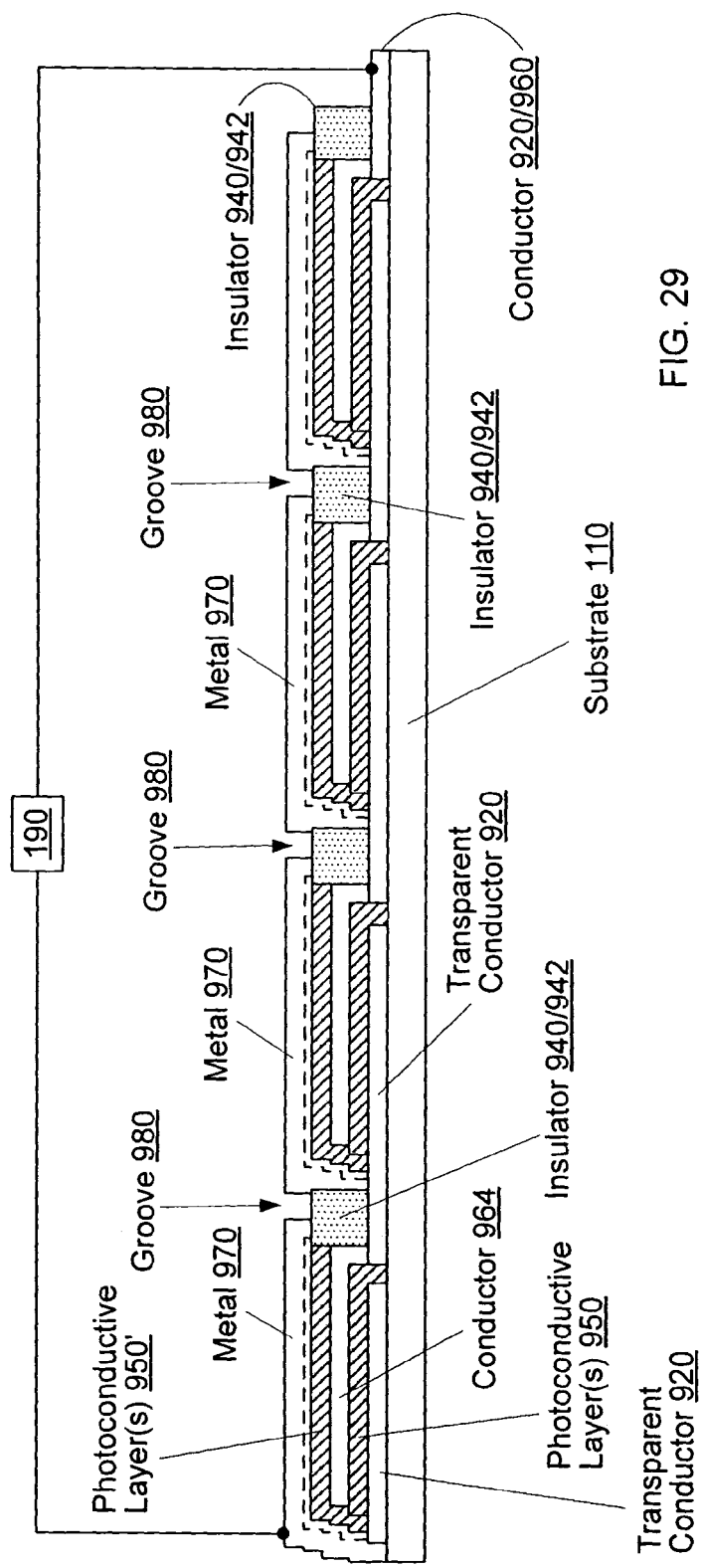

FIGS. 27-29 illustrate modules comprising series-connected cells formed by the processes described above. The cross-sections of the individual cells are simply examples, and any of the aforementioned cross-sections and structures may be used. Individual cells may contain a stack of subcells electrically connected within the stack in series (similar to FIG. 7), and may contain a stack subcells electrically connected within the stack in parallel (i.e., FIG. 29, similar to FIG. 8). The encapsulating metal layer in each cell is electrically separated from an adjacent cell by groove 980, providing an insulative break between cells. The groove 980 may be formed, for example, by use of shadow-masking during deposition of metal 971 and 972, or by laser etching the metals 971 and 972.

Additionally, with each of the devices having the encapsulating electrode 970, a smoothing layer such as anode smoothing layer 122 may be added to the bottom electrode 920, as can the other structures and layers described above with FIGS. 2-8.

As described above, use of vapor deposition in vacuum to form an electrode tends to produce a somewhat porous electrode. Vacuum deposition is more expensive and less reliable than sputtering for the purpose of encapsulation, and requires substantially thicker coverage to reliably provide equivalent permeability. However, while sputtering is preferred for the formation of the thin protective metal layer 971, it is contemplated that under some circumstances, it may be advantageous to form the thin protective metal layer using vacuum thermal evaporation (VTE) instead of sputtering.

For most processes, switching metal deposition methods mid-stream increases manufacturing complexity (since metal 972 will still be formed by sputtering to ensure good coverage and low permeability), and increases the likelihood of exposure to contaminants. However, an example where forming the thin protective metal layer by VTE instead of sputtering might be advantageous is if the photoconductive layer(s) 950 are deposited by vapor deposition and the protective metal layer can be deposited by VTE in a same deposition chamber. If the structure must be moved between deposition chambers after formation of the photoconductive layer(s) 950 and before the sputtering of metal layer 972, or ambient conditions must otherwise undergo a substantial change between these steps, having deposited the thin protective metal layer by VTE may lessen the impact of the transition.

If VTE is substituted for sputtering to form the thin protective metal layer in the processes describe above, the growth rate should be no more than 1 nm/s (as with sputtering) to a thickness of no less than 10 nm, and the preferred growth rate remains 0.1 to 1 nm/s. These growth conditions mitigate damage to the underlying organic materials while the thin protective metal layer is formed, and the threshold thickness prevents the occurrence of sputtering-induced damage in the underlying organic materials when metal 972 is deposited. Metal 972 is again deposited by sputtering at a rate of deposition at least three times higher than the rate used with VTE. The cumulative thickness of the metal (VTE and sputtered) is at least 250 nm. The ultimate thickness of the combined VTE and sputtered metal depends upon the permeability rate of $H_2O$ and $O_2$, for the particular metal as deposited, but is preferably between 250 nm and 2.5 μm. Permeability through the combination of the VTE and sputtered metals is again preferably no more than $5 \times 10^{-6}$ g/m$^2$/day (25° C.) for $H_2O$; more preferably, no more than $1 \times 10^{-6}$ g/m$^2$/day (25° C.) for $H_2O$; no more than $5 \times 10^{-6}$ cm$^3$/m$^2$/day/atm (25° C.) for $O_2$; and more preferably, no more than $1 \times 10^{-6}$ cm$^3$/m$^2$/day/atm (25° C.) for $O_2$.

While the metal used for the thin protective metal layer (such as sputtered layer 971 or the substitute VTE layer) and the thick sputtered layer 972 will typically be a same metal, it may sometimes be desirable to use different metals. For example, the metal selected for the thin protective layer can be chosen to optimize or minimize the damage induced in underlying organic layers, and/or can be chosen for its ability to draw charge carriers out of the underlying organic layer. Similarly, the metal selected for the thick protective layer can be chosen for compatibility with fast-deposition sputtering and/or superior permeability. Using different metals for these layers may also be efficient or convenient if switching deposition processes between layers.

In summary, while other forms of encapsulation may be used with the encapsulating electrode 970, the dual-functionality of the encapsulating electrode to conduct electricity and act as a barrier to contaminants offers enhanced performance by minimizing the material interfaces with the underlying organic layers relied upon to maintain the integrity of the device. Use of metal to form encapsulating electrode enhances contaminant protection and design flexibility. Moreover, use of metal reduces the structural requirements for secondary packaging.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell).

Specific examples of the invention are illustrated and/or described herein. However, it will be appreciated that modifications and variations of the invention are covered by the above teachings and within the purview of the appended claims without departing from the spirit and scope of the invention. Photosensitive device structures other than those specifically described may be used in connection with the encapsulating electrode and method of fabricating such an electrode.

What is claimed is:

1. A method of forming an organic photosensitive optoelectronic device comprising:
   providing a first transparent film comprising a first electrically conductive material, arranged on a transparent substrate;
   depositing one or more photoconductive organic materials over the first electrically conductive material;
   depositing a first metal at an initial rate of no more than 1 nm/s over said one or more photoconductive organic materials, wherein said first metal completely covers and is in physical contact with the top and any exposed portions of said one or more photoconductive organic materials and any exposed interfaces with said one or more photoconductive organic materials, to a thickness of no less than 10 nm; and
   after the thickness of no less than 10 nm is obtained, sputtering a second metal at an increased rate at least three times the initial rate until a cumulative thickness of the first and second metals completely covering the previously exposed portions of said one or more photoconductive organic materials and the previously exposed interfaces with said one or more photoconductive organic materials is at least 250 nm.

2. The method of claim 1, wherein the depositing of the first metal at the initial rate of no more than 1 nm/s is performed by sputtering.

3. The method of claim 2, wherein the transition from the initial rate to the increased rate is performed as a continuous, uninterrupted sputtering process.

4. The method of claim 3, wherein the transition from the initial sputtering rate to the increased sputtering rate occurs when the thickness of the first metal is no more than 30 nm.

5. The method of claim 1, wherein the depositing of the first metal at the initial rate of no more than 1 nm/s is performed by vacuum thermal deposition.

6. The method of claim 1, wherein the increased rate is in the range of 1 to 10 nm/s.

7. The method of claim 1, wherein the second metal is sputtered at the increased rate until the cumulative thickness with the first metal deposited at the initial rate is between 250 nm and 2.5 μm.

8. The method of claim 7, wherein the first and second metals having the cumulative thickness between 250 nm and 2.5 μm together have a permeability of no more than $5 \times 10^6$ g/m$^2$/day (25° C.) for $H_2O$ and a permeability of no more than $5 \times 10^{-6}$ cm$^3$/m$^2$/day/atm (25° C.) for $O_2$.

9. The method of claim 8, wherein the permeability is no more than $1 \times 10^{-6}$ cm$^3$/m$^2$/day/atm (25° C.)/day (25° C.) for $H_2O$ and no more than $1 \times 10^{-6}$ cm$^3$/m$^2$/day/atm (25° C.) for $O_2$.

10. The method of claim 1, wherein the first and second metals and said one or more photoconductive organic materials each cover a continuous area of not less than 1 cm$^2$.

11. The method of claim 10, wherein the first and second metals and said one or more photoconductive organic materials each cover a continuous area of not less than 10 cm$^2$.

12. The method of claim 1, further comprising depositing and patterning an electrically non-conductive material prior to depositing said one or more photoconductive organic materials.

13. The method of claim 12, wherein the electrically non-conductive material overlaps the first electrically conductive material, a portion of the first electrically conductive material extending out from beneath the electrically non-conductive material to provide a wiring contact that is electrically isolated from the first and second metals covering the previously exposed portions of said one or more photoconductive organic materials.

14. The method of claim 1, wherein the one or more photoconductive organic materials comprises at least two photoconductive organic materials, the at least two photoconductive organic materials forming a planar, mixed, bulk, or hybrid donor-acceptor heterojunction.

15. The method of claim 1, wherein the first metal and the one or more photoconductive organic materials form a Schottky-barrier heterojunction.

16. The method of claim 1, further comprising shadow-masking during the deposition of the first metal and the sputtering of the second metal to form a plurality of adjacent cells on the transparent substrate, each cell comprising at least one photoactive region including the one or more photoconductive organic materials, the cells being electrically connected in series.

17. The method of claim 1, further comprising laser-etching the first and second metals to form a plurality of adjacent cells on the transparent substrate, each cell comprising at least one photoactive region including the one or more photoconductive organic materials, the cells being electrically connected in series.

18. The method of claim 1, wherein the first metal and the second metal are a same material.

19. The method of claim 1, wherein the first metal and the second metal are different materials.

20. A method of forming an organic photosensitive optoelectronic device, comprising:
provided a first transparent film comprising a first electrically conductive material, arranged on a transparent substrate;
providing a second electrically conductive material, the second electrically conductive material arranged to be electrically isolated from the first electrically conductive material;
depositing and patterning an electrically non-conductive material over the second electrically conductive material;
depositing one or more photoconductive organic materials over the electrically non- conductive material;
depositing a second transparent film comprising a third electrically conductive material over said one or more photoconductive organic materials, a portion of the third electrically conductive material being in physical contact with the second electrically conductive material, the third electrically conductive material deposited to be electrically isolated from the first electrically conductive material; and
depositing one or more additional photoconductive organic materials over said second transparent film comprising the third electrically conductive material,
depositing a first metal at an initial rate of no more than 1 nm/s over said one or more additional photoconductive organic materials, wherein said first metal completely covers and is in physical contact with the top and any exposed portions of said one or more additional photoconductive organic materials and any exposed interfaces with said one or more additional photoconductive organic materials, to a thickness of no less than 10 nm; and
after the thickness of no less than 10 nm is obtained, sputtering a second metal at an increased rate at least three times the initial rate until a cumulative thickness of the first and second metals completely covering the previously exposed portions of said one or more additional photoconductive organic materials and the previously exposed interfaces with said one or more additional photoconductive organic materials is at least 250 nm.

21. The method of claim 20, wherein the first electrically conductive material and the second electrically conductive material are a same material.

* * * * *